United States Patent
Byun

(10) Patent No.: US 7,123,540 B2
(45) Date of Patent: Oct. 17, 2006

(54) SEMICONDUCTOR DEVICE HAVING DELAY-LOCKED LOOP AND TEST METHOD THEREOF

(75) Inventor: Gyung-Su Byun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 10/836,333

(22) Filed: May 3, 2004

(65) Prior Publication Data

US 2004/0227550 A1 Nov. 18, 2004

(30) Foreign Application Priority Data

May 12, 2003 (KR) .................. 10-2003-0029760

(51) Int. Cl.
*G11C 8/00* (2006.01)
(52) U.S. Cl. ............ 365/233; 365/201; 327/149; 327/158
(58) Field of Classification Search ......... 365/201, 365/233; 327/158, 149
See application file for complete search history.

(56) References Cited

U.S. PATENT DOCUMENTS

| | | | | |
|---|---|---|---|---|
| 5,463,337 A | * | 10/1995 | Leonowich | 327/158 |
| 5,923,613 A | * | 7/1999 | Tien et al. | 365/233 |
| 6,392,456 B1 | * | 5/2002 | Pyeon et al. | 327/156 |
| 6,400,643 B1 | * | 6/2002 | Setogawa | 365/233 |
| 6,448,756 B1 | * | 9/2002 | Loughmiller | 324/76.54 |
| 6,570,815 B1 | | 5/2003 | Kashiwazaki | |
| 6,577,554 B1 | * | 6/2003 | Song et al. | 365/233 |
| 6,839,301 B1 | * | 1/2005 | Lin et al. | 365/233 |
| 6,940,325 B1 | * | 9/2005 | Lee | 327/158 |

FOREIGN PATENT DOCUMENTS

| | | |
|---|---|---|
| JP | 2002-324398 | 11/2002 |
| KR | 1020010047839 A | 6/2001 |
| KR | P2003-0009030 | 1/2003 |

\* cited by examiner

*Primary Examiner*—Richard Elms
*Assistant Examiner*—Eric J. Wendler
(74) *Attorney, Agent, or Firm*—Volentine Francos & Whitt

(57) ABSTRACT

A semiconductor device having a delay-locked loop includes: a variable delayer that delays a clock signal for a predetermined period of time to generate an internal clock signal; a normal pass that outputs data read from a memory cell outside the semiconductor device in response to the internal clock signal; a replica pass that has a substantial identical time delay to the normal pass and delays the internal clock signal to generate an output signal; and a phase detector that compares a phase of the clock signal with a phase of a predetermined feedback clock signal to control a time delay in the variable delayer. Here, the internal clock signal is output, instead of the output signal from the replica pass, as the predetermined feedback clock signal in a predetermined test mode.

13 Claims, 4 Drawing Sheets

SEMICONDUCTOR DEVICE HAVING DELAY-LOCKED LOOP AND TEST METHOD THEREOF

CROSS REFERENCES RELATED TO APPLICATIONS

This application claims the priority of Korean Patent Application No. 2003-29760, filed on May 12, 2003, in the Korean Intellectual Property Office, the entirety of which is hereby incorporated by reference herein for all purposes as if fully set forth herein.

BACKGROUND AND SUMMARY

1. Technical Field

The present invention relates to a semiconductor device, and more particularly, to a semiconductor device having a delay-locked loop and a test method thereof.

2. Description

A synchronous memory device synchronizes with an external clock signal to input and output data. A high-speed memory device generally uses a delay-locked loop (DLL) to synchronize data with an external clock signal.

FIG. 1 is a block diagram of a general semiconductor memory device having a DLL. Referring to FIG. 1, the semiconductor memory device includes a DLL 110 and a normal pass 160.

The DLL 110 includes a variable delayer 120, a replica pass 130, and a phase detector 140. The variable delayer 120 delays a clock signal CLK/CLKB for a predetermined period of time in response to a delay control signal CON output from the phase detector 140 to generate an internal clock signal IN_CLK. The normal pass 160 outputs internal data IDATA outside the semiconductor memory device in response to the internal clock signal IN_CLK. The DLL 110 includes the replica pass 130, which is a replica of the normal pass 160, in order to compensate for a time delay occurring in the normal pass 160. The phase detector 140 compares a phase of the clock signal CLK/CLKB with a phase of a replica clock signal DQR to control a time delay in the variable delayer 120 so that the replica clock signal DQR is in phase with the clock signal CLK/CLKB.

Accordingly, when the phase of the replica clock signal DQR synchronizes with the phase of the clock signal CLK/CLKB, data DQ output from the normal pass 160 having the same time delay as the replica pass 130 also synchronizes with the clock signal CLK/CLKB.

Therefore, in order to accurately lock the DLL 110, complicated circuits of the normal pass 160 must be exactly replicated as circuits of the replica pass 130 on a one-to-one basis. With an increase in the high speed of the semiconductor memory device, the clock characteristics of the replica pass 130 of the DLL 110 are quite important. In particular, as the operational frequency of the semiconductor memory device gets faster and the operational voltage thereof gets lower, the reliability of a clock signal in the replica pass 130 degrades, which may cause the DLL 110 to abnormally operate. In other words, as the operational frequency of a semiconductor memory device gets higher and the operational voltage thereof gets lower, the possibility for a DLL to abnormally operate may be higher due to a replica pass.

As described above, a DLL is highly likely to malfunction due to a replica pass. However, it is not easy to check under a general DLL test whether the DLL operates normally or abnormally due to the replica pass. Consequently, the complicated replica pass should be optional in a predetermined test mode to easily check whether the DLL malfunctions due to the replica pass.

Accordingly, it would be desirable to provide a semiconductor device having a DLL in which a check can be easily achieved whether the DLL operates normally or abnormally. It would also be desirable to provide a test method capable of easily checking whether a DLL operates normally or abnormally in a semiconductor device having the DLL.

According to one aspect of the present invention, there is provided a semiconductor device including a variable delayer, a normal pass, a replica pass, and a phase detector. The variable delayer delays a clock signal for a predetermined period of time to generate an internal clock signal. The normal pass outputs data read from a memory cell outside the semiconductor device in response to the internal clock signal. The replica pass has a substantially identical time delay to the normal pass and delays the internal clock signal to generate an output signal. The phase detector compares a phase of the clock signal with a phase of a predetermined feedback clock signal to control a time delay in the variable delayer. Here, the internal clock signal instead of the output signal from the replica pass is output as the predetermined feedback clock signal in a predetermined test mode.

Preferably, the replica pass includes components that substantially equal components of the normal pass. That is, the replica includes components that are replicas of the normal pass on a one-to-one basis.

The semiconductor device further includes a multiplexer that selects one of the output signal from the replica pass and the internal clock signal to output the selected signal as the predetermined feedback clock signal in response to a predetermined mode signal.

According to another aspect of the present invention, there is provided a semiconductor device including a normal pass and a delay-locked loop. The normal pass receives data read from a memory cell and outputs the received data in response to an internal clock signal. The delay-locked loop receives an external clock signal to generate the internal clock signal, and includes a replica pass which compensates for a time delay in the normal pass. The delay-locked loop forms a loop excluding the replica pass in a predetermined test mode, while the delay-locked loop forms a loop including the replica pass in a non-test mode.

The delay-locked loop includes a variable delayer, a multiplexer, and a phase detector. The variable delayer delays the clock signal for a predetermined period of time to generate the internal clock signal. The multiplexer selects one of an output signal from the replica pass and the internal clock signal to output the selected signal as a feedback clock signal in response to a predetermined mode signal. The phase detector compares a phase of the clock signal with a phase of the feedback clock signal to control the time delay in the variable delayer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
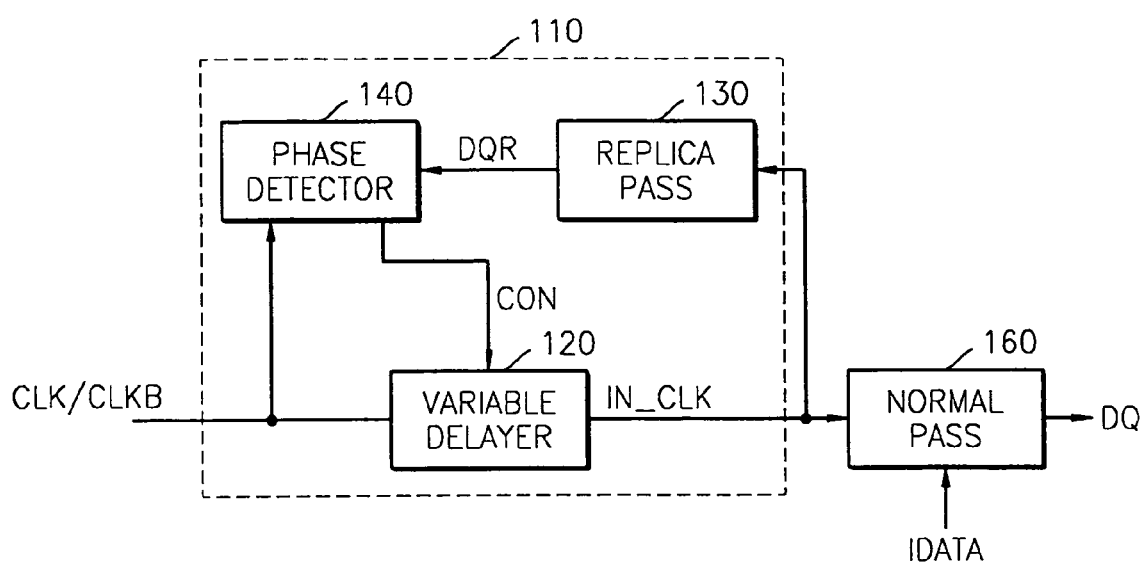
FIG. 1 is a block diagram of a general semiconductor memory device having a DLL.

Hereinafter, the present invention will be described in detail with reference to the attached drawings. Like reference numerals in the drawings denote the same members.

Figure 2:
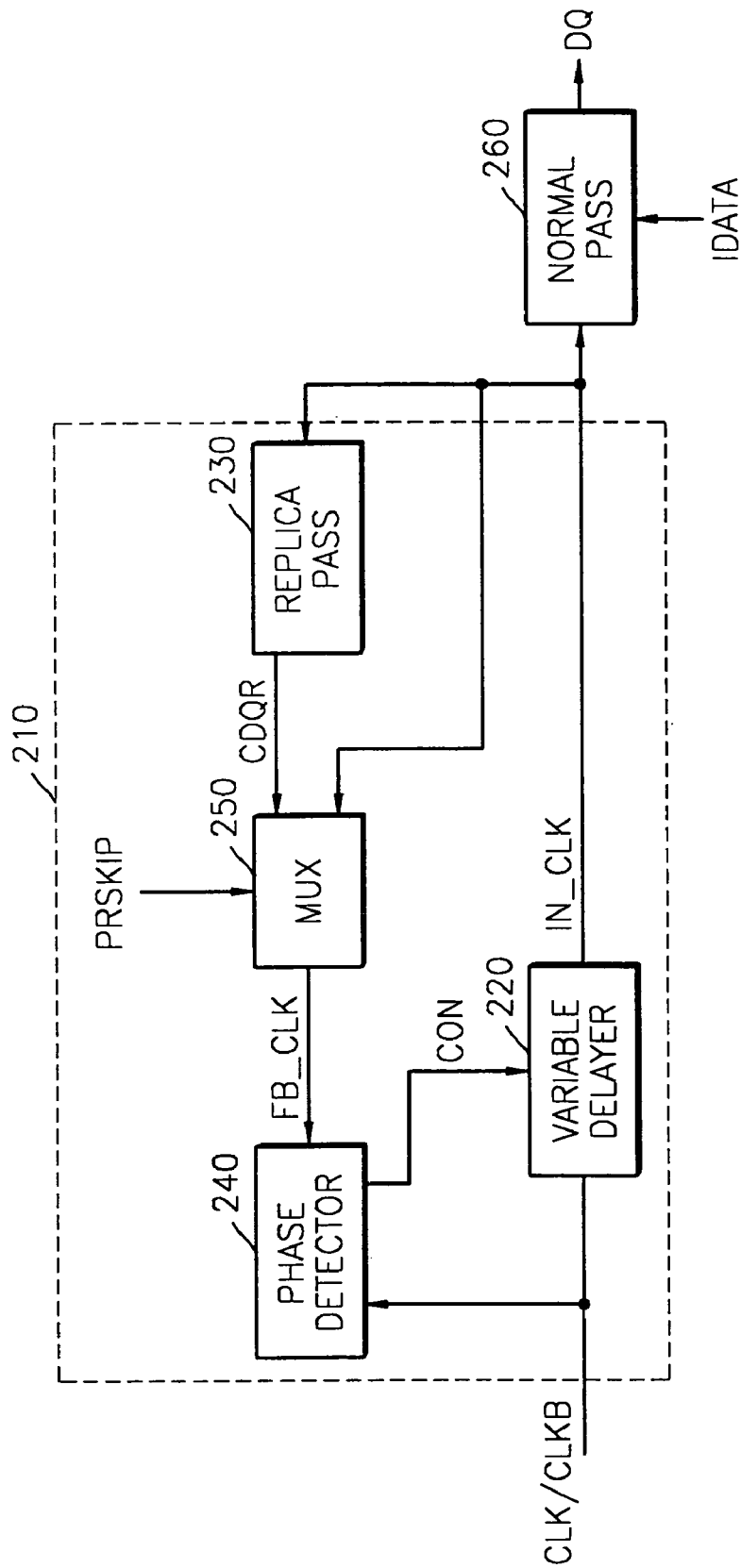
FIG. 2 is a block diagram of a first embodiment of a semiconductor device according to one or more aspects of the present invention.

FIG. 2 is a block diagram of a semiconductor device. Referring to FIG. 2, the semiconductor device includes a DLL 210 and a normal pass 260.

The DLL 210 receives a clock signal CLK/CLKB from an external source and delays the clock signal CLK/CLKB for a predetermined period of time to generate an internal clock signal IN_CLK. The normal pass 260 reads data IDATA from a memory cell (not shown) and then outputs the data IDATA from the semiconductor device in response to the internal clock signal IN_CLK. When the DLL 210 is locked, data DQ output from the normal pass 260 is synchronized with the clock signal CLK/CLKB. The normal pass 260 may include an output driver (not shown) which drives the data DQ outside the semiconductor device.

The DLL 210 includes a variable delayer 220, a replica pass 230, a phase detector 240, and a multiplexer 250. The variable delayer 220 delays the clock signal CLK/CLKB for a predetermined period of time to generate the internal clock signal IN_CLK. The time delay in the variable delayer 220 is controlled by a delay control signal CON output from the phase detector 240.

The replica pass 230 compensates for a time delay in the normal pass 260, and preferably, includes components that are replicas of the normal pass 260 on a one-to-one basis. The replica pass 230 delays the internal clock signal IN_CLK for a predetermined period of time and then outputs the delayed internal clock signal (CDQR). The multiplexer 250 selects one of a signal CDQR output from the replica pass 230 and the internal clock signal IN CLK to output the selected signal as a feedback clock signal FB_CLK in response to a mode signal PRSKIP. The phase detector 240 compares a phase of the clock signal CLK/CLKB with a phase of the feedback clock signal FB_CLK to generate the delay control signal CON for controlling the time delay in the variable delayer 220.

The mode signal PRSKIP is enabled in a predetermined test mode, e.g., in a replica pass bypassing test mode. Thus, the internal clock signal IN_CLK is output as the feedback clock signal FB_CLK without passing through the replica pass 230 in the replica pass bypassing test mode. Therefore, although an error occurs in the replica pass 230, the DLL 210 normally operates. In a case where the DLL 210 excludes the replica pass 230, the data DQ output from the normal pass 260 does not synchronize with the clock signal CLK/CLKB. However, when a semiconductor device test system knows about a time delay in the normal pass 260, the semiconductor device test system can receive and test the data DQ that is output with delay from the clock signal CLK/CLKB for the predetermined period of time. Accordingly, the semiconductor device test system can test the semiconductor device using the DLL 210 excluding the replica pass 230.

In a non-replica pass bypassing test mode, the signal CDQR, which has been output by the replica pass 230, is output as the feedback clock signal FB_CLK. In other words, the DLL 210 includes the replica pass 230. In this case, when the DLL 210 is locked, the data DQ output from the normal pass 260 is synchronized with the feedback clock signal FB_CLK and thus also with the clock signal CLK/CLKB.

If a determination is made that the DLL 210 abnormally operates in the non-replica pass bypassing test mode, while the DLL 210 normally operates in the replica pass bypassing test mode, it is easy to check that the replica pass 230 has an error. Also, since the DLL 210 excluding the replica pass 230 can be tested, testing whether the DLL operates normally or abnormally can be easily carried out.

In the embodiment of FIG. 2, the multiplexer 250 is located outside the replica pass 230. However, the multiplexer 250 may be positioned at a last part of the replica pass 230, i.e., an output part. Whether the multiplexer 250 is included in the replica pass 230 or not, it is preferable that the total time delay from the replica pass 230 to the multiplexer 250 is equal to the time delay in the normal pass 260. Only in this case, the phase of the feedback clock signal FB_CLK passing through the replica pass 230 can be identical to the phase of the data DQ output from the normal pass 260.

Figure 3:
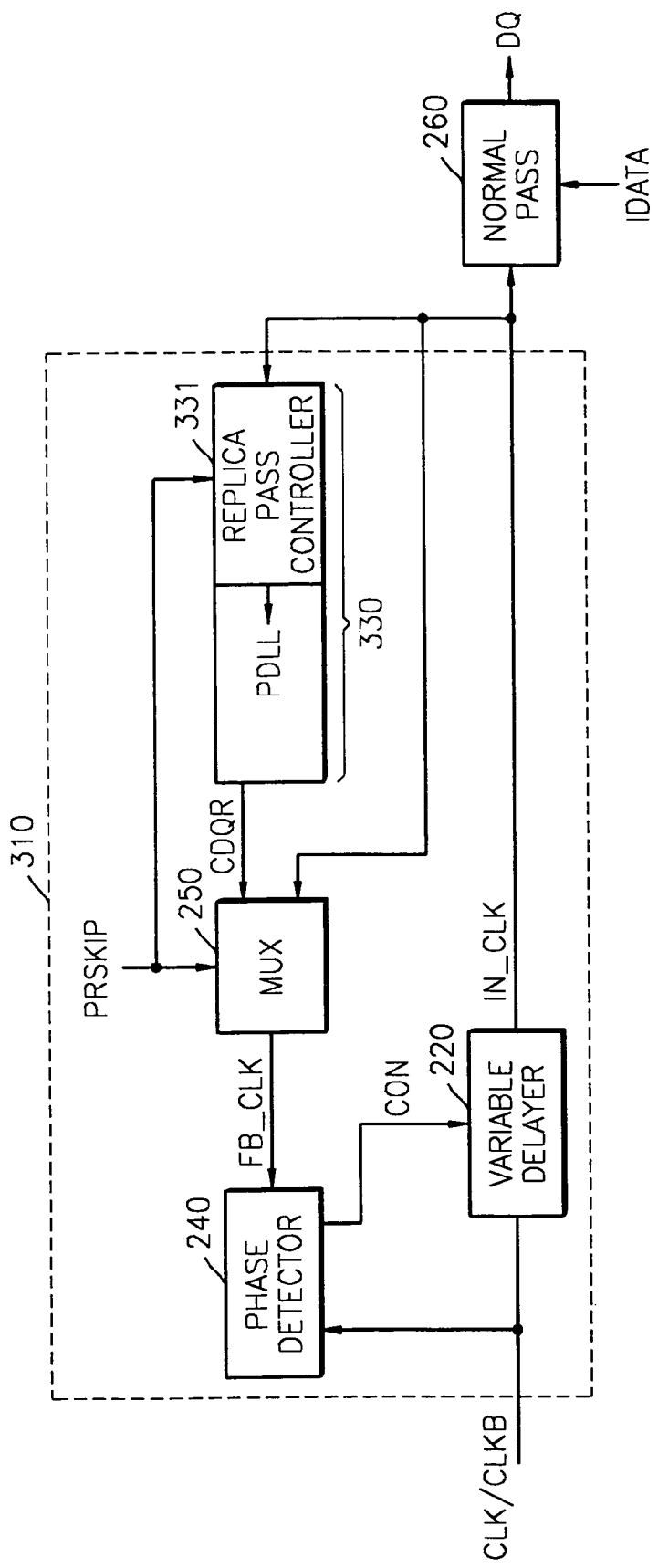
FIG. 3 is a block diagram of a second embodiment of a semiconductor device according to one or more aspects of the present invention.

FIG. 3 is a block diagram of a semiconductor device according to another embodiment. In similarity to the semiconductor device shown in FIG. 2, the semiconductor device of FIG. 3 includes a DLL 310 and a normal pass 260. The DLL 310 includes a variable delayer 220, a replica pass 330, a multiplexer 250, and a phase detector 240. The variable delayer 220, the multiplexer 250, and the phase detector 240 except the replica pass 330 are the same as the variable delayer 220, the multiplexer 250, and the phase detector 240 described in the previous embodiment, and thus will not be explained herein.

The replica pass 330 of FIG. 3 includes a replica pass controller 331 which is located in a front end of the replica pass 330 to receive an internal clock signal IN_CLK. The replica pass controller 331 disables the replica pass 330 in response to a mode signal PRSKIP. In other words, the replica pass controller 331 disables the replica pass 330 in a replica pass bypassing test mode.

Figure 4:
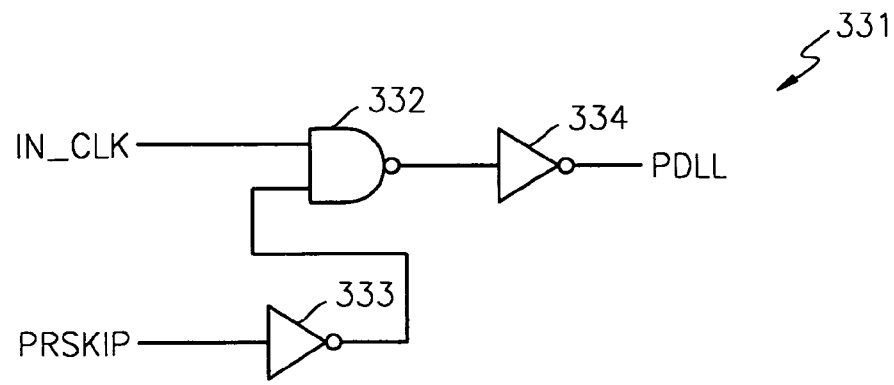
FIG. 4 is a circuit diagram of a replica pass controller shown in FIG. 3.

FIG. 4 shows a circuit diagram of the replica pass controller 331. Referring to FIG. 4, the replica pass controller 331 includes a NAND gate 332, and two inverters 333 and 334. The NAND gate 332 performs an NAND operation on an inverted signal of the mode signal PRSKIP and the internal clock signal IN_CLK. The inverter 334 inverts the output from the NAND gate 332. The mode signal PRSKIP is enabled to be logic "high" in the replica pass bypassing test mode. A signal PDLL output from the inverter 334 is then logic "low". The signal PDLL output from the inverter 334 passes through a plurality of components of the replica pass 330 and then is output as a signal CDQR. In this case, since the signal PDLL output from the inverter 334 is logic "low", the components of the replica pass 330 located after the replica pass controller 331 do not operate. In other words, if the mode signal PRSKIP is enabled to be logic "high", the signal CDQR output from the replica pass 330 is maintained at the logic "low" level not being toggled to the logic "high" level and/or the logic "low" level. Accordingly, the replica pass 310 can be disabled so as to reduce power consumption in the replica pass bypassing test mode.

A replica pass, which does not include the replica pass controller 331, e.g., the replica pass 230 shown in FIG. 2, may include two or more inverters (not shown) connected in series in the front end of the replica pass 230. In the replica pass 230 having the above-described structure, a NAND gate may replace the first inverter of the two inverters and an inverter for inverting the mode signal PRSKIP may be additionally installed. As a result, the replica pass 230 may be constituted like the replica pass 330 shown in FIG. 3.

Figure 5:
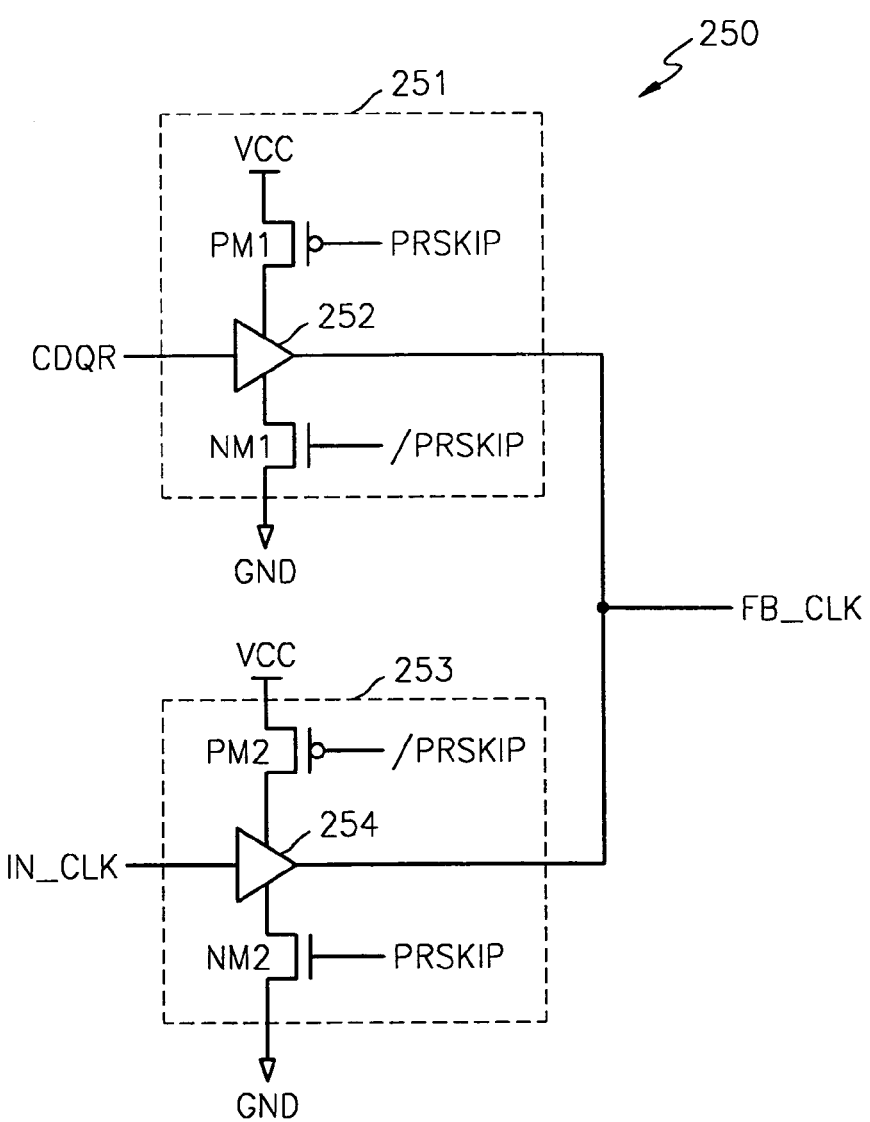
FIG. 5 is a circuit diagram of a multiplexer shown in FIG. 2 or 3.

FIG. 5 is a circuit diagram of the multiplexer 250 shown in FIG. 2 or 3. Referring to FIG. 5, the muktiplexer 250 includes first and second switches 251 and 253.

The first switch 251 passes the signal CDQR output from the replica pass 230 or 330 in response to the mode signal PRSKIP. The second switch 253 passes the internal clock signal IN_CLK in response to the mode signal PRSKIP.

The first switch 251 includes an buffer 252, a P-Type Metal Oxide Semiconductor (PMOS) transistor PM1 which is connected between the buffer 252 and a power voltage VCC, and an N-Type Metal Oxide Semiconductor (NMOS) transistor NM1 which is connected between the buffer 252 and a ground voltage GND. The mode signal PRSKIP is input to a gate of the PMOS transistor PM1, and an inverted signal /PRSKIP of the mode signal PRSKIP is input to a gate of the NMOS transistor NM1. When the mode signal PRSKIP is disabled to be the logic "low", the PMOS transistor PM1 and the NMOS transistor NM1 are turned on. Thus, when the mode signal PRSKIP is logic "low", the signal CDQR output from the replica pass 230 or 330 is output as the feedback clock signal FB_CLK via the inverter 252.

The second switch 253 includes a buffer 254, a PMOS transistor PM2 which is connected between the buffer 254 and a power voltage VCC, and an NMOS transistor NM2 which is connected between the buffer 254 and a ground voltage GND. The mode signal PRSKIP is input to a gate of the NMOS transistor NM2, and the inverted signal /RPSKIP of the mode signal PRSKIP is input to a gate of the PMOS transistor PM2. When the mode signal PRSKIP is enabled to be logic "high", the PMOS transistor PM2 and the NMOS transistor NM2 are turned on. Thus, when the mode signal PRSKIP is logic "high", the internal clock signal IN_CLK is output as the feedback clock signal FB_CLK via the buffer 254.

As previously described with reference to FIG. 3, it is preferable that the total time delay in the replica pass 330 and the multiplexer 250 is identical to the time delay in the normal pass 260.

The internal clock signal IN_CLK is output as the feedback clock signal FB_CLK without passing through the replica pass 330 in the replica pass bypassing test mode. The replica pass 330 is disabled by the replica pass controller 331. In this case, the semiconductor device is tested using the DLL 310 excluding the replica pass 330.

The signal CDQR, which has been output from the replica pass 330, is output as the feedback clock signal FB_CLK in the non-replica pass bypassing test mode. In other words, the DLL 210 includes the replica pass 230. In this case, when the DLL 210 is locked, the data DQ output from the normal pass 260 synchronizes with the feedback clock signal FB_CLK and thus also with the clock signal CLK/CLKB.

The mode signal PRSKIP may be generated using a mode register set (MRS) signal.

As described above, according to the present invention, when a semiconductor device having a DLL is tested, the semiconductor device can be tested by either bypassing, or including, a complicated replica pass. Accordingly, it is easy to check whether the replica pass of the DLL operates normally or abnormally.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a variable delayer that delays a clock signal for a set period of time to generate an internal clock signal;
   a normal pass that outputs data read from a memory cell outside the semiconductor device in response to the internal clock signal;
   a replica pass that has a substantially identical time delay to the normal pass and delays the internal clock signal to generate an output signal; and
   a phase detector that compares a phase of the clock signal with a phase of a set feedback clock signal to control a time delay in the variable delayer,
   wherein the internal clock signal instead of the output signal from the replica pass is output as the set feedback clock signal in a set test mode.

2. The semiconductor device of claim 1, wherein the replica pass comprises components that are replicas of the normal pass on a one-to-one basis.

3. The semiconductor device of claim 1, further comprising a multiplexer that selects one of the output signal from the replica pass and the internal clock signal to output the selected signal as the set feedback clock signal in response to a set mode signal.

4. The semiconductor device of claim 3, wherein the replica pass comprises a replica pass controller that disables the replica pass in response to the set mode signal.

5. The semiconductor device of claim 3, wherein the set test mode is a replica pass bypassing test mode, and the set mode signal is enabled in the replica pass bypassing test mode.

6. A semiconductor device comprising:
   a normal pass that receives data read from a memory cell and outputs the received data in response to an internal clock signal; and
   a delay-locked loop that receives a clock signal to generate the internal clock signal and comprises a replica pass which compensates for a time delay in the normal pass,
   wherein the delay-locked loop forms a loop excluding the replica pass in a set test mode, while the delay-locked loop forms a loop including the replica pass in a non-test mode.

7. The semiconductor device of claim 6, wherein the delay-locked loop comprises:
   a variable delayer that delays the clock signal for a set period of time to generate the internal clock signal;
   a multiplexer that selects one of an output signal from the replica pass and the internal clock signal to output the selected signal as a feedback clock signal in response to a set mode signal; and
   a phase detector that compares a phase of the clock signal with a phase of the feedback clock signal to control the time delay in the variable delayer.

8. The semiconductor device of claim 7, wherein the replica pass comprises components that are replicas of the normal pass on a one-to-one basis.

9. The semiconductor device of claim 7, wherein the replica pass comprises a replica pass controller that disables the replica pass in response to the set mode signal.

10. The semiconductor device of claim 7, wherein the set test mode is a replica pass bypassing test mode, and the set mode signal is enabled in the replica pass bypassing test mode.

11. A method of testing a semiconductor device comprising a delay-locked loop comprising a replica pass for compensating for a time delay in a normal pass, the method comprising:

delaying a clock signal for a set period of time to generate an internal clock signal;

outputting data read from a memory cell outside the semiconductor device in response to the internal clock signal;

comparing a phase of the clock signal with a phase of a set feedback clock signal to vary the set period of time in the delay of the clock signal; and outputting the internal clock signal as the set feedback clock signal in a set test mode and outputting an output signal from the replica pass as the set feedback clock signal in a non-test mode.

12. The method of claim 11, wherein the varying of the set period of time comprises:

allowing a multiplexer to respond to a set mode signal so as to select one of the internal clock signal and the output signal from the replica pass.

13. The method of claim 12, further comprising:

disabling the replica pass in response to the predetermined mode signal.

* * * * *